United States Patent [19]
Chan et al.

[11] Patent Number: 6,026,026
[45] Date of Patent: Feb. 15, 2000

[54] SELF-CONVERGENCE OF POST-ERASE THRESHOLD VOLTAGES IN A FLASH MEMORY CELL USING TRANSIENT RESPONSE

[75] Inventors: I-Chuin Peter Chan, San Jose; Feng Frank Qian, Campbell; Hsingya Arthur Wang, Saratoga, all of Calif.

[73] Assignee: Hyundai Electronics America, Inc., San Jose, Calif.

[21] Appl. No.: 08/985,833

[22] Filed: Dec. 5, 1997

[51] Int. Cl.⁷ ..................................................... G11C 16/04
[52] U.S. Cl. .................................. 365/185.3; 365/185.29; 365/185.33
[58] Field of Search ........................... 365/185.3, 185.22, 365/185.18, 185.33, 185.29

[56] References Cited

U.S. PATENT DOCUMENTS

| | | | |
|---|---|---|---|
| 5,357,476 | 10/1994 | Kuo et al. | 365/185.12 |
| 5,406,524 | 4/1995 | Kawamura et al. | 365/185 |
| 5,491,657 | 2/1996 | Haddad et al. | 365/185.27 |
| 5,650,964 | 7/1997 | Chen et al. | 365/185.25 |
| 5,687,118 | 11/1997 | Chang | 365/185.27 |
| 5,751,631 | 5/1998 | Liu et al. | 365/185.19 |
| 5,790,460 | 8/1998 | Chen et al. | 365/185.29 |

OTHER PUBLICATIONS

S. Yamada, et al., "A Self–Convergence Erasing Scheme for a Simple Stacked Gate Flash EEPROM", *IEDM Tech. Dig.*, 1991, pp. 11.4.1–11.4.4.

K. Oyama, et al., "A Novel Erasing Technology for 3.3V Flash Memory with 64Mb Capacity and Beyond", *IEDM Tech. Dig.*, 1992, pp. 607–610.

P. Pavan, et al., "Flash Memory Cells—An Overview", Proceedings of the IEEE, vol. 85, No. 8, (Aug. 1987), pp. 1248–1271.

*Primary Examiner*—David Nelms
*Assistant Examiner*—Gene N. Auduong
*Attorney, Agent, or Firm*—Townsend and Townsend and Crew LLP

[57] ABSTRACT

An erase method provides for self-converging erase on a flash memory cell by rapidly switching a bias on a control gate while a lateral field is present in a channel region. Preferably, the lateral field is provided by differentially biasing the source and drain of the cell and the change in bias of the control gate is sufficiently fast to induce a transient response at the floating gate. The net transient vertical field formed across a tunneling oxide between the channel region and the floating gate causes moderate hot carrier injection between the channel region and the floating gate. This method is self-converging, since carrier injection to the floating gate will not happen unless a sufficient number of carriers are removed from the floating gate during the array step. Since the bulk of the self-converging effect occurs as the control gate voltage is transitioning and shortly thereafter, very little time is needed at the end of an erase pulse to effect this response.

14 Claims, 8 Drawing Sheets

SELF-CONVERGENCE OF POST-ERASE THRESHOLD VOLTAGES IN A FLASH MEMORY CELL USING TRANSIENT RESPONSE

BACKGROUND OF THE INVENTION

The present invention relates generally to flash memory cells, and more specifically to a novel method of erasing flash memory cells.

A flash memory is a specific type of nonvolatile memory. Specifically, a flash memory comprises a plurality of EEPROM (electrically erasable programmable read-only memory) cells which are bitwise or bytewise programmable to any combination of data values, but are erased as a group, hence the term "flash" memory. Each group of cells which can be erased separately from other groups of cells is referred to as a "sector" of the flash memory. A flash memory can have one or more sectors. In a typical embodiment of the simplest flash memory cell, a cell comprises a single transistor with a control gate, a source and a drain. The source and drain are embedded in a substrate separated by a channel. The control gate overlies at least a part of the channel region and is electrically insulated therefrom, typically by an oxide layer.

When certain voltages are applied to the source, drain and control gate, current can be made to flow between the source and drain through the channel. In the typical flash memory cell, a floating gate is interposed between at least a part of the channel and at least a part of the control gate, insulated each of those components. Since the floating gate is isolated from the other components, it tends to retain a charge placed thereon, and therefore, by associating particular amounts of charge with particular stored values, bits of information can be stored in the cell by varying the amount of charge on the floating gate.

By convention, adding charge to (subtracting electrons from) the floating gate is referred to as "programming" the cell, while the opposite is referred to as "erasing" the cell. Additional details of conventional flash memory devices are shown in U.S. Pat. Nos. 4,698,787, 5,077,691, 5,313,086 and 5,521,886, each of which is incorporated by reference herein for all purposes.

A memory cell is read by biasing the cell and measuring the current through the cell. The voltage, Vt, at which the cell saturates affects how much current passes through the cell, and therefore is an important indicator of contents of the cell, as is well known in the art of flash memories. Preferably, Vt is a positive voltage, because otherwise the cell would turn on even in the absence of an applied control gate voltage. A condition where the threshold voltage Vt is negative is referred to as an "over-erase" condition. Because an over-erased cell would turn on even in the absence of a control voltage, the over-erase condition is to be avoided.

Several approaches to avoiding over-erased cells have been in use. One method of avoiding over-erase is referred to as hot carrier injection during source disturb. Details of this method can be found in S. Yamada, "A Self-Convergence Erase for NOR Flash EEPROM Using Avalanche Hot Carrier Injection", *IEEE Trans. Electron Devices*, vol. 43, pp. 1937–1941, November 1996, which is incorporated by reference herein for all purposes. With this approach, the control gate, drain and substrate are grounded while the source is biased at 6.5V. At these biases, a weak hot carrier injection will be created because a lateral field will exist and the floating gate charge will be at a different potential than the substrate (either holes or electrons will flow to the floating gate, depending on its potential). The hot carriers are injected into the floating gate, and with the reinsertion of charge onto the floating gate, threshold voltage will rise to a stable threshold voltage above ground potential. While this method may be used to raise the threshold voltage above the ground potential, it requires extra design work and increases the probability for error as additional circuitry is required to control this over-erase correction process. Additionally, the above-described process lengthens the time needed to erase a cell by as much as 100 ms (milliseconds). Furthermore, additional time and circuitry are needed to verify whether over-erased cells have been corrected.

An additional disadvantage of this method is that if the hot carrier injection takes place near the drain, oxide trap-up and interface generation cause serious read current degradation, thereby shortening the endurance margin. If the hot carrier injection takes place at the source, the adverse effects are not as great. Nevertheless, it is inefficient to try hot carrier injection when the control gate is grounded, because a strong vertical field would not be present to assist the carriers through the oxide.

Some of the above disadvantages may be overcome by using Fowler-Nordheim (FN) tunneling. With this approach, the source and drain are grounded, the control gate is set to a positive voltage and the substrate is set to a negative voltage. This method also has the disadvantage of requiring time, design effort, and chip real estate. An example of this process is described as a two-step erasing scheme described in K. Oyama, et al., "A Novel Erasing Technology for 3.3V Flash Memory With 64 Mb Capacity and Beyond," *IEDM Tech. Dig.*, 1992, pp. 607–610, which is incorporated herein by reference for all purposes. As described there, the second step of the two-step process can add as much as 100 ms to an erase step.

From the above, it is seen that an improved method of correcting for over-erase is needed.

SUMMARY OF THE INVENTION

In one embodiment of an over-erase method according to the present invention for performing a self-converging erase on a flash memory cell a bias on a control gate is rapidly switched while a lateral field is present in the cell's channel region. Preferably, the lateral field is provided by differentially biasing the source and drain of the cell and preferably the change in bias of the control gate is sufficiently fast to provoke a transient response at the floating gate. The net transient vertical field formed across the tunneling oxide between the channel region and the floating gate causes moderate hot carrier injection from the channel region to the floating gate.

In a specific embodiment, the control gate bias falls from a negative voltage to zero, inducing a positive transient response on the floating gate, and thus the hot carrier injection is electron injection to the floating gate. This method is self-converging, since carrier injection onto the floating gate will not happen unless a sufficient number of carriers are removed from the floating gate during the erase step. Since the bulk of the self-converging effect occurs immediately after the control gate voltage transitions and shortly thereafter, very little time is needed at the end of an erase pulse to effect this response.

One advantage of this erase process is that it requires no substantial extra procedures to correct for over-erase, which simplifies circuit design.

Another advantage of the erase process is increased reliability. Since hot carrier injection takes place at the source side, it has an insignificant effect on the read current. Also, with the vertical field assisting the hot carrier injection process, injection is very efficient and requires less time.

A further understanding of the nature and advantages of the invention herein may be realized by reference to the remaining portions of the specification and the attached drawings.

DESCRIPTION OF THE PREFERRED EMBODIMENTS

Figure 1:
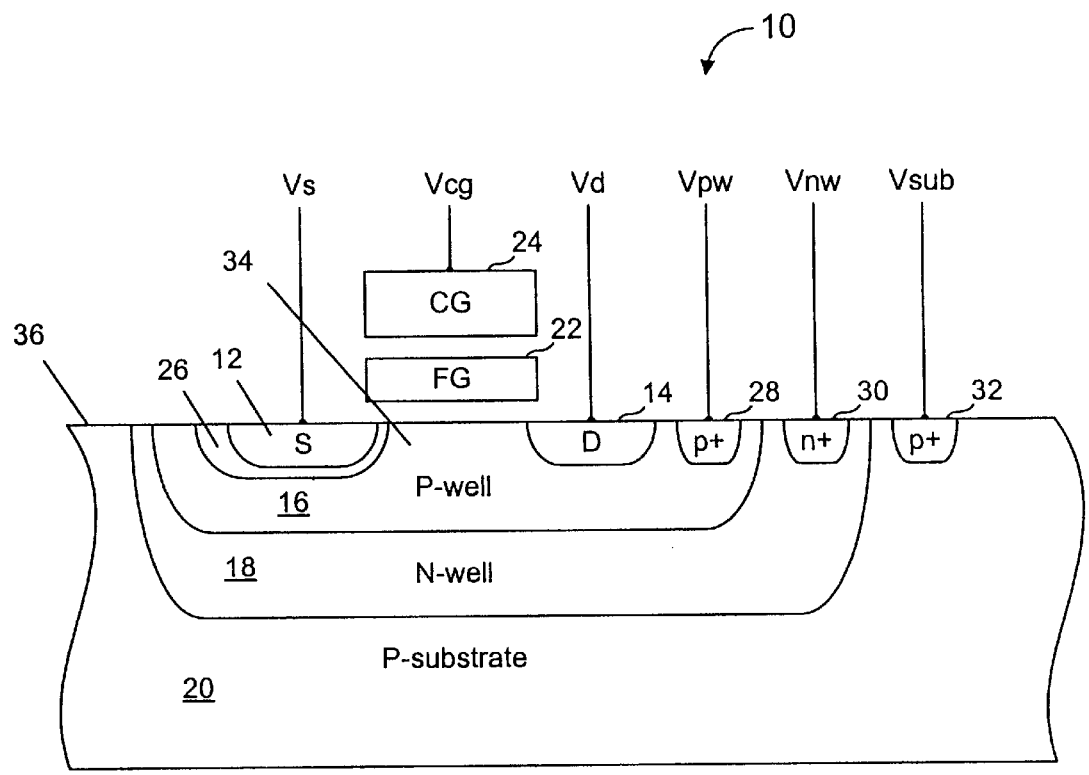
FIG. 1 is a cross-sectional view of an isolated P-well flash memory cell to which an erase process according to the present invention is applied.

FIG. 1 is a cross-sectional view of a flash memory cell 10. Flash memory cell 10 is an "isolated P-well cell", so named because a source 12 (or "the source") and a drain region 14 (the "drain") of cell 10 are enclosed within an isolated P-type well 16 ("P-well"). P-well 16 is in turn enclosed within an N-type well 18 ("N-well"), which is formed on a P-type substrate 20. Typically, a flash memory chip will contain multiple P-wells, each isolated from each other, within N-wells, which are isolated from each other. In some cases, all of the sources and drains for all the cells in a sector are located in one P-well. In the following description of an erase method according to the present invention, the method will be described with reference to isolated P-well cells. However, it should be apparent after reading this description that the method can be applied to other types of flash memory cells without undue experimentation, such as Hyundai Electronics America's triple-well cell or a substrate cell. Additionally, the present invention can be implemented in cells with or without the double-diffused source shown in FIG. 1.

The other components of cell 10 shown in FIG. 1 include a floating gate (FG) 22, a control gate (CG) 24, a source diffusion region 26, a P-well connection region 28 having a P+ diffusion, an N-well connection region 30 having an N+ diffusion, and a substrate connection region 32 having a P+ diffusion. By the placement of the components there shown, a channel region 34 (or "the channel") is formed in P-well 16 between source 12 and drain 14. Although not shown, it should be understood that FG 22 is isolated from CG 24 and channel region 34 by an insulating layer or layers. Typically, the insulating layer between FG 22 and channel region 34 is an oxide layer while the insulating layer between FG 22 and CG 24 is an oxide-nitride-oxide ("ONO") layer. A cell can be implemented using 0.35 μm (micrometer) design rules, but the present invention will also work with many other sets of design rules.

FIG. 1 also shows leads connected to various components used to set bias levels on those components and convey current and to perform other steps as can be done with leads. The components and voltage designations for the leads shown are as follows: source →Vs, control gate →Vcg, drain →Vd, P-well →Vpw, N-well →Vnw and substrate →Vsub.

Figure 2:
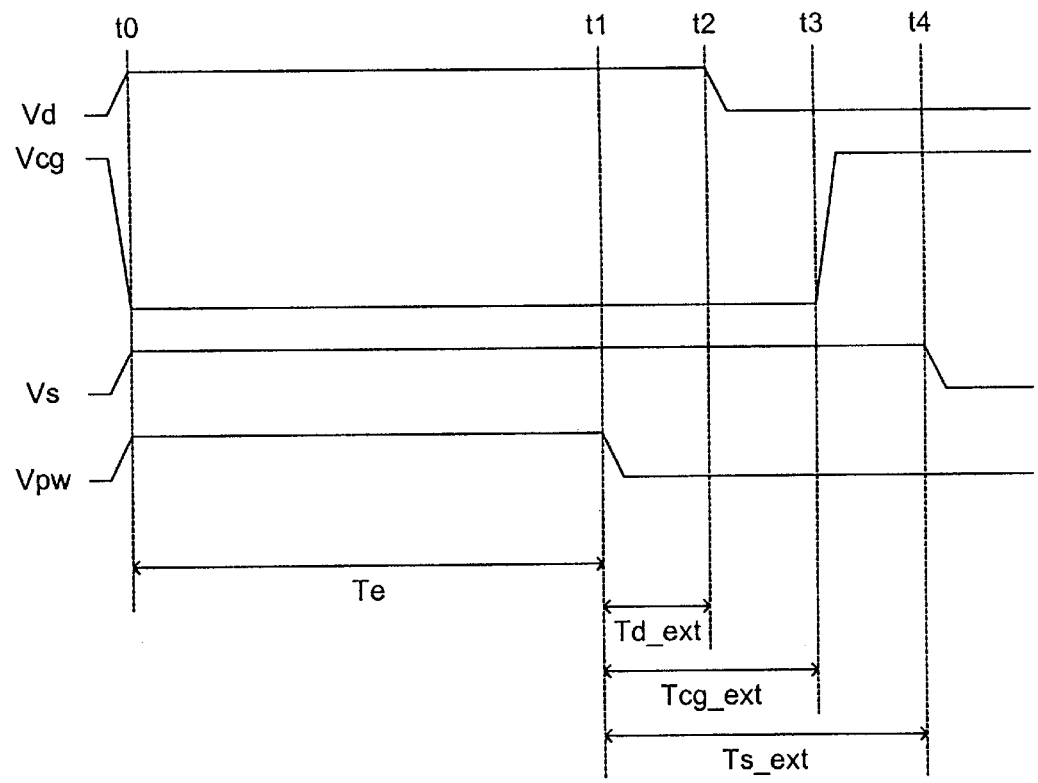
FIG. 2 is a timing diagram showing the voltages on various leads of the cell shown in FIG. 1 according to one embodiment of the present invention.

Referring now to FIG. 2, a timing diagram is there shown. The timing diagram shows the voltages which might be applied to the leads of cell 10 in one embodiment of an erase method according to the present invention. Only one erase cycle is there shown, but it should be understood that more than one erase cycle might occur for a cell. Furthermore, although the timing diagram of FIG. 2 is described with reference to a single cell 10, it should be understood that the erase process typically applies to many cells at once.

As shown, the erase process begins at time t0, with Vs and Vd going high, Vcg going low and Vpw going high and kept at those levels for an erase interval of Te (from t0 to t1). Specific voltage levels are not shown in FIG. 2, as many voltage levels might be used. The particular levels are typically a function of the process design rules and power supply rails and other considerations which are known to one of ordinary skill in the art. Typically, Vs, Vd, Vcg and Vpw are kept between 0V and a maximum voltage (the voltages described herein are relative to substrate 20, or other reference as is known in the art, and can be negative or positive). The maximum Vs is typically less than +15V, preferably between +4V and +8V. The maximum Vd is typically less than +15V, preferably between +0V and +4V. The maximum Vcg is typically between −1V and −15V (depending on context, as in this case, "maximum" may refer to a large negative value), preferably between −6V and −10V. The maximum Vpw is typically less than +15V, preferably between +0V and +4V (while these values are the same for the drain and P-well, the drain and P-well do not have to be at the same bias). As shown in FIG. 2, each of the bias voltages there begin at a base level, usually 0V, move to their maximum value and return to their base level.

For erasing, a negative bias voltage is applied to the control gate while positive biases are applied to the source, drain and body. "Body" generically refers to the region underneath the source and drain; "body" refers to the P-well in an isolated P-well cell and to the substrate in a substrate cells; "body" might also generally refer to everything below a substrate plane (such as plane 36 in FIG. 1) except for the source and drain. In a specific example, the erase is performed with the maximum values of Vcg=−9V, Vs=5V, Vd=3V and Vpw=3V.

At t0, the bias voltages are ramped up as shown in FIG. 2. The order in which the voltages are ramped up, if any, is not essential to the erase method, but it is preferred that the voltages are ramped at t0 (and at other times), such that no forward bias conditions exist across any semiconductor junction of cell 10, to avoid wasted forward bias current. In FIG. 2, the ramping times and the time periods shown are not necessarily to scale.

In FIG. 2, several time intervals are identified. Te, from t0 to t1, is the erase interval; Td_ext, from t1 to t2 is a "drain bias extension" interval; Tcg_ext, from t1 to t3 is a "control gate bias extension interval; and Ts_ext, from t1 to t4 is a "source bias extension" interval. In general, the extension intervals represent times where a corresponding component remains biased beyond the end of the erase interval Te.

After Vcg falls (i.e., ramps "down" from a negative voltage to zero bias) beginning at t3 while source 12 and drain 14 are differentially biased, a transient voltage is induced on floating gate 22 while a lateral field exists in channel region 34 (because source 12 and drain 14 are differentially biased). Although FIG. 2 shows Vd falling before Vs, it should be apparent from this description that similar effects can be had if Vs were to fall before Vd, so long as Vcg falls between the time Vs falls and the time Vd falls. To keep the junctions from being forward biased, Vpw should fall before either Vd or Vs falls.

The transient voltage capacitively induced on floating gate 22 following the fall of Vcg provides a vertical field to assist the hot carriers generated by the still remaining lateral field in channel region 34 to be injected into floating gate 22. Because the falling of Vcg occurs anyway, no additional time is needed to perform this over-erase correction step. The step is self-correcting, because the over-erase correction is weaker when the floating gate has not been over-erased and the correction is stronger when the floating gate has been over-erased. This is because the charge on the floating gate affects the net transient vertical field induced by the falling of Vcg.

A typical value for Te is 10 ms. Longer erase times can be provided for, either by lengthening Te or by having multiple erase cycles. A typical value for Ts_ext is 10 $\mu$s (microseconds), but often 20 $\mu$s is sufficient because the transient response at the floating gate does not usually last longer than that. However, the longer Ts_ext allows for greater margins in design and process variation.

Figure 3:
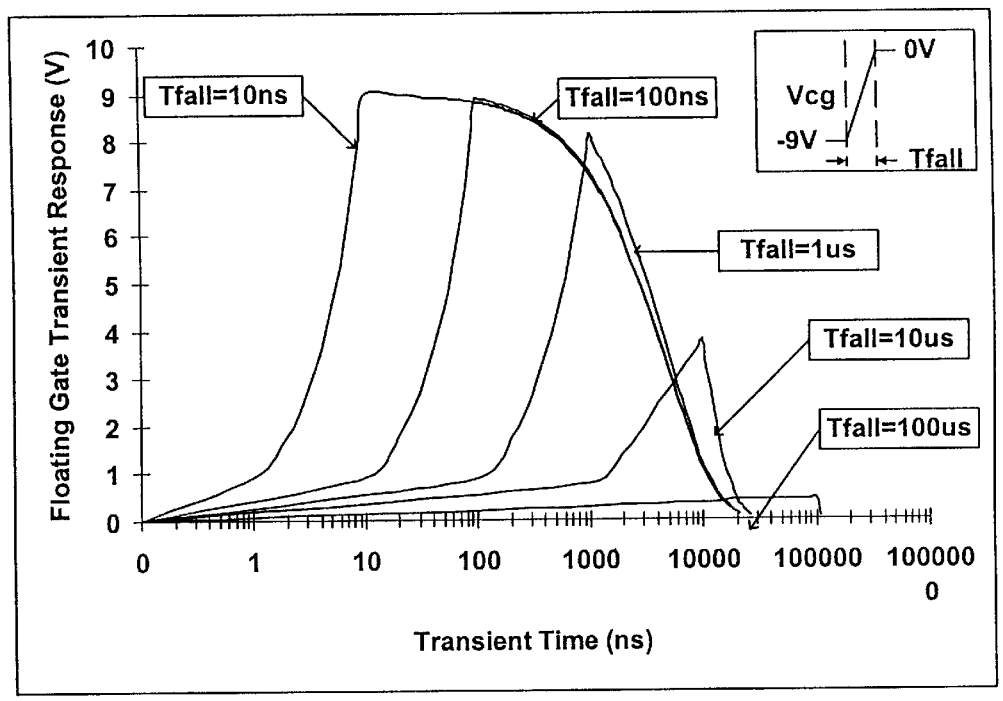
FIG. 3 is a plot from a simulation of floating gate transient response over time to a change in a control gate voltage for various control gate voltage change rates.

Among other determinants, the rate at which Vcg falls determines the magnitude and duration of the transient response. FIG. 3 is a plot of simulated transient responses for different fall times (Tfall) of Vcg, as Vcg falls from −9V to 0V. Five curves are there shown, representing the transient response voltage over time in response to fall times of 10 ns, 100 ns, 1 $\mu$s, 10 $\mu$s and 100 $\mu$s. As can be seen there, the faster fall times (10 ns, 100 ns) result in larger transient responses. In the preferred embodiment, the fall time is as fast as is needed to generate an adequate transient response. The fall time can be faster, but preferably not so fast that additional design constraints are imposed.

Figure 4:
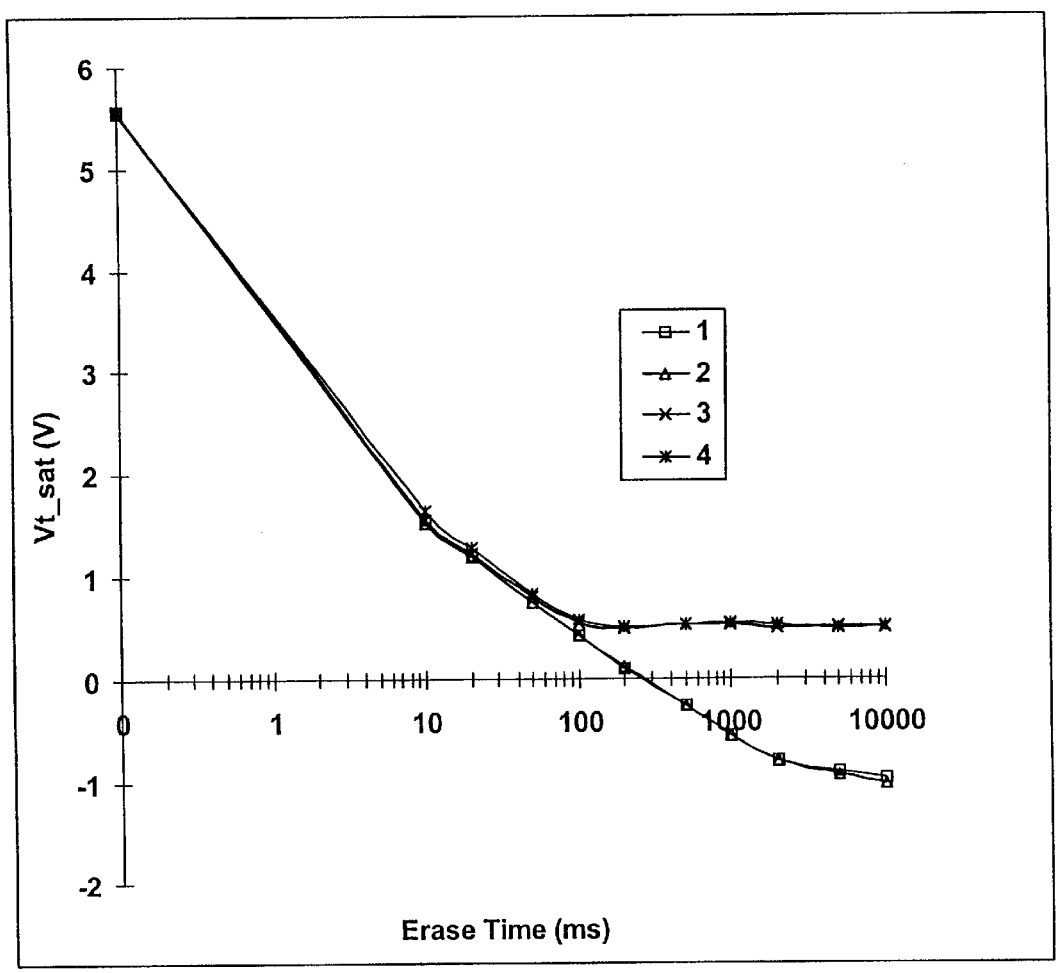
FIG. 4 is a plot comparing post-erase threshold voltages in two embodiments of an erased method according to the present invention and two conventional source erase methods.

FIG. 4 is a plot of four curves representing threshold voltage convergences over increasing erase times for different conditions. In each case, Vcg=−9V, Vs=5V, Vpw=0V and Tfall=10 $\mu$s. Of course, immediately following Tfall, Vcg=0 and all other values are the same. Curve 1 plots the threshold voltage (Vt) versus erase time where the drain is left floating. With a floating drain, the cell reaches an over-erased condition (Vt<0V) for erase periods longer than about 300 ms. Curve 2 plots Vt where the drain is biased to 0V, which results in a similar over-erased condition. For both curves 1 and 2, there is essentially no time where there is a lateral field in the channel region and Vcg is falling, i.e., Td_ext=0, Tcg_ext=0, and Ts_ext=0. Curve 2 shows that, even where there is a lateral field during erase, it has little effect if the field is turned off when the Vcg transition occurs.

In contrast, curves 3 and 4 show a convergence to a stable, positive post-erase Vt. In each of these latter two cases, the bias on the source is maintained for a nonzero period. The conditions for curve 3 are an example which might be represented by the sequence of events shown in FIG. 2, as Td_ext=100 $\mu$s, Tcg_ext=200 $\mu$s and Ts_ext=300 $\mu$s. The conditions for curve 4 differ from those of curve 3 in that Td_ext and Tcg_ext are collapsed to zero. Note that this has little effect on the post-erase Vt. Thus, curve 4 demonstrates that only the source voltage need be extended for the desired effect to occur.

Figure 5:
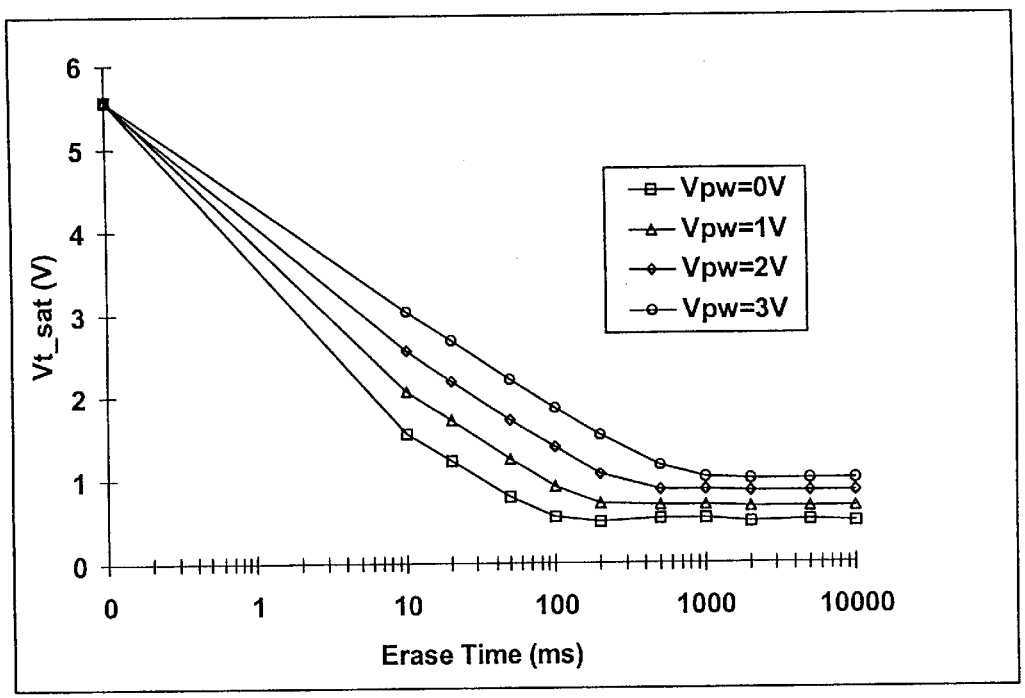
FIG. 5 is a plot showing the effects of different drain-well common biases.

FIG. 5 shows the effect of applying a varied common bias to both the drain and the P-well. Using a common bias alleviates problems caused by band-to-band tunneling current by lowering the source to P-well voltage differential. However, it does so at the cost of erase speed. Each of the curves in FIG. 5 are based on Vcg=−9V, Vs=5V, Td_ext=100 $\mu$s, Tcg_ext=200 $\mu$s, Ts_ext=300 $\mu$s and Tfall=10 $\mu$s.

Figure 6:
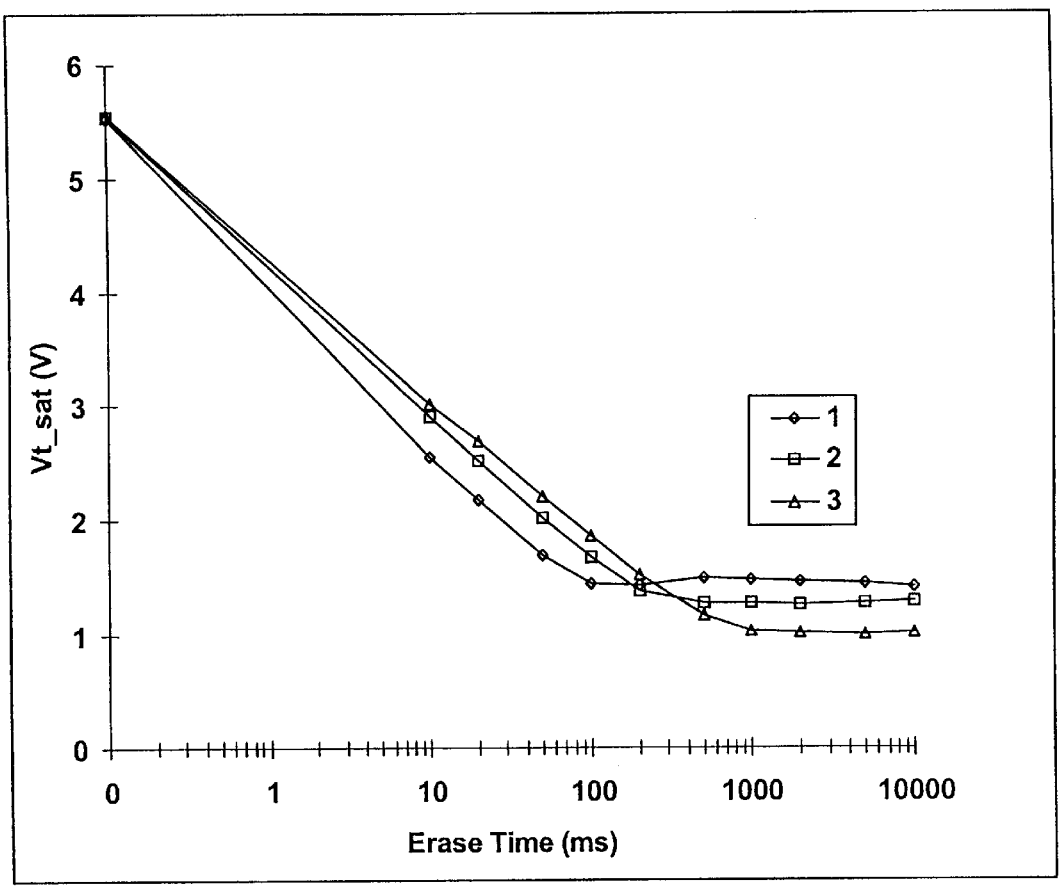
FIG. 6 is a plot illustrating the effects of various combinations of control gate voltage and source voltage.

FIG. 6 shows the effect of varying the various bias levels of the cell, while maintaining a lateral field and using the same timing as in the curves of FIG. 5. Each curve is Vt versus erase time using the same timing as was used in FIG. 5, namely Td_ext=100 $\mu$s, Tcg_ext=200 $\mu$s and Ts_ext= 300 $\mu$s. For the curve of FIG. 6, Vpw and Vd have the same bias, the source is biased 2V above the P-well drain bias and the control gate is biased −14V relative to the source. The three curves shown in FIG. 6 are for a Vpw/Vd bias of 5V, 4V and 3V.

Note that in each curve in FIG. 6, Vt converges to a positive voltage, indicating that the advantages of using the transient response can be obtained while still allowing flexibility in the design and technology development. For instance, with Vpw as high as 5V (curve 1), Vcg can be as small as −7V. This makes a flash memory easier to implement, as the maximum voltages used can be limited to 7V and −7V. An additional benefit is shown by curve 1, in that Vd=5V results in a faster erase speed while maintaining an adequate convergence level.

Figure 7:
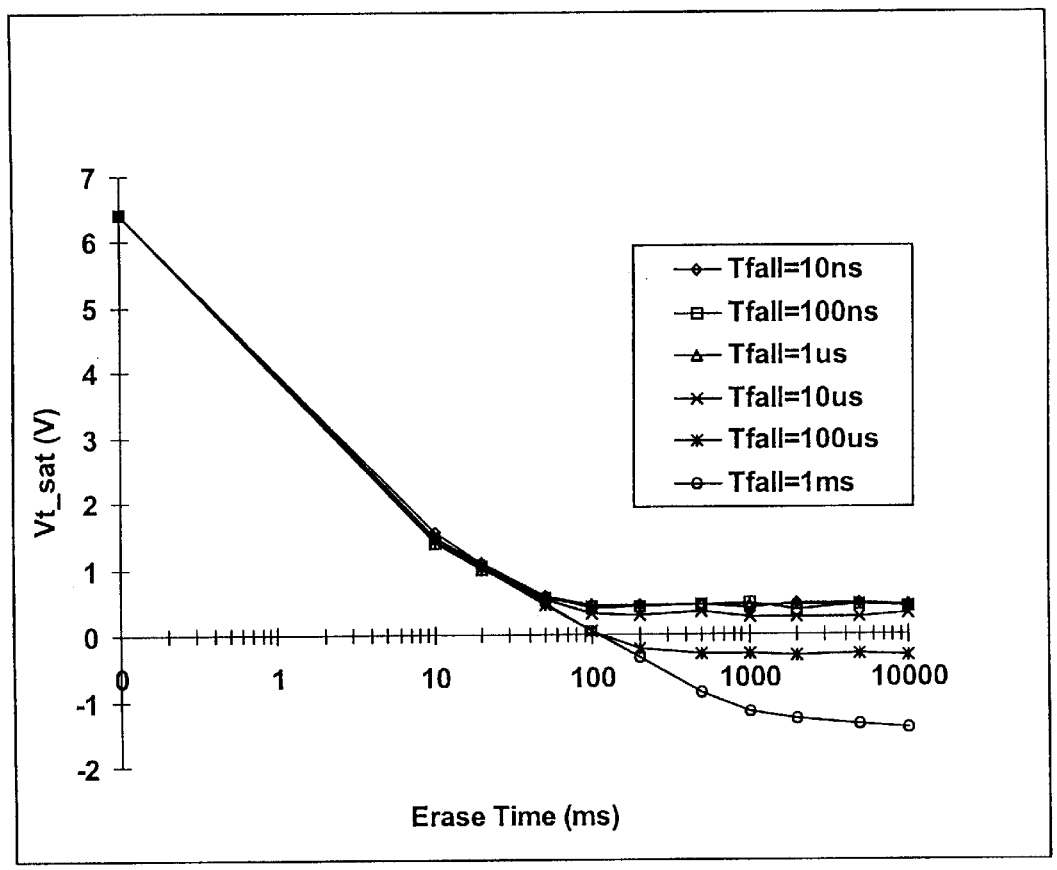
FIG. 7 is a plot showing convergence at different threshold voltages for different control gate voltage fall times.

FIG. 7 shows the effect of varying Tfall values. In each of six tests, the biases and other timing remained the same: Vd=Vpw=0V, Vs=5V, Vcg=−9V, Td_ext=100 $\mu$s, Tcg_ext= 200 $\mu$s and Ts_ext=300 $\mu$s. The six curves correspond to Tfall values of 10 ns, 100 ns, 1 $\mu$s, 10 $\mu$s, 100 $\mu$s and 1 ms. As shown in FIG. 3, shorter Tfall intervals result in higher maximum transient voltages occurring earlier during the effective transient interval and the convergence to a positive post-erase Vt does not occur if Tfall is too slow. As the curves for Tfall=100 $\mu$s and Tfall=1 ms indicate, over-erase can occur if Vcg falls too slowly. This can also be seen from FIG. 3, as the transient voltage for Tfall=100 $\mu$s is small and not enough to trigger any substantial hot electron injection. The results shown in FIG. 7 also demonstrate that for a Tfall interval of 10 $\mu$s or less, the convergence level and rate are substantially similar. This is most likely due to the net transient vertical field gradually decreasing as the floating gate regains electrons via mild hot electron injection, to the point where no more hot electron injection occurs.

Figure 8:
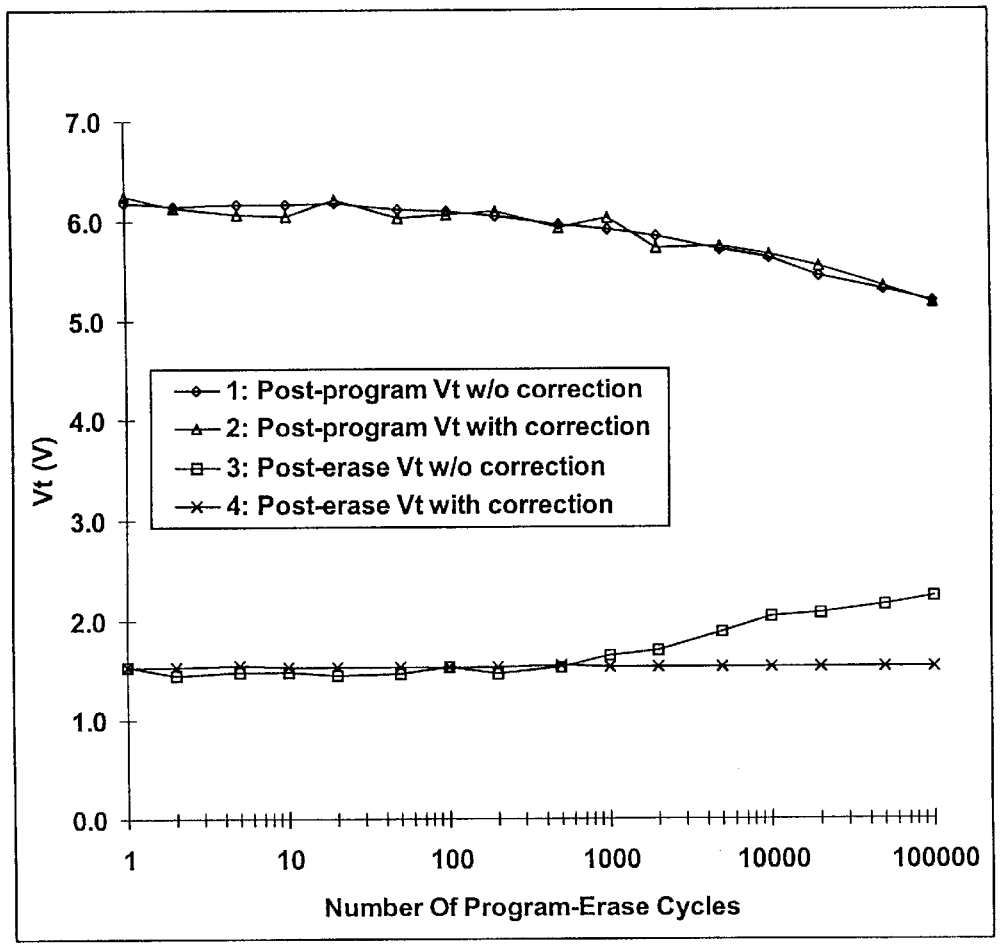
FIG. 8 is a plot of threshold voltages following program step and following an erase step for both a method according to the present invention and a conventional source erase method.

FIG. 8 illustrates the endurance characteristics of a cell using the transient response over-erase correction and those of a cell using a typical source erase process. For the two programming curves (1 and 2), programming was done with a programming interval of Tp=10 $\mu$s with biases of Vd=5V, Vs=0V, Vcg=9V, Vsub=0V. For the two erase curves (3 and 4), erasing was done with an erase interval of Te=10 ms, a fall time of Tfall=10 $\mu$s, and biases of Vs=5V, Vcg=−9V and Vsub=0V. In both cases, Td_ext and Tcg_ext were zero, but for the erase without the correction (curve 3), Ts_ext was zero and Vd was left floating, while the erase with correction (curve 4), had Ts_ext=100 $\mu$s and Vd=0V.

Note that the post-erase Vt with the correction is constant up to 100,000 program-erase cycles. The improved endurance is most likely due to mild hot electron injection on the source side neutralizing holes trapped in the oxide on the source side during the erase interval Te.

As the above description has shown, an erase method utilizing the transient response by having a sharp fall of the control gate voltage while a lateral field is present effectively eliminates over-erase problems and results in an optimal post-erase Vt distribution, as well as improving endurance performance. This description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method of erasing a flash memory cell, comprising the steps of:

erasing the flash memory cell;

biasing a drain and a source differentially, thereby creating channel current between the source and the drain from which carriers are injected to a floating gate; and following the step of biasing, changing a control gate bias sufficiently quickly to capacitively induce an induced voltage on the floating gate while a lateral field is present in a channel region, wherein the induced voltage is a voltage sufficient to induce hot carrier injection from the channel region to the floating gate.

2. The method of claim 1, further comprising a step of biasing the drain at a voltage lower than a bias on the source, prior to the step of changing, thereby creating channel current from the source to the drain from which carriers are injected to the floating gate.

3. The method of claim 1, further comprising a step of biasing the source at a voltage lower than a bias on the drain, prior to the step of changing, thereby creating channel current from the drain to the source from which carriers are injected to the floating gate.

4. The method of claim 1, wherein the step of changing is a step of dropping the control gate bias from a high negative voltage relative to a cell body to a zero voltage relative to the cell body.

5. The method of claim 1, wherein the step of erasing and the step of changing are done with each semiconductor junction of the flash memory cell being unbiased or reverse biased.

6. The method of claim 1, wherein the flash memory cell is an isolated P-well flash memory cell.

7. The method of claim 1, wherein the flash memory cell is a substrate cell.

8. A method of erasing a flash memory cell, comprising the steps of:

erasing the flash memory cell;

changing a control gate bias sufficiently quickly to capacitively induce an induced voltage on a floating gate while a lateral field is present in a channel region, wherein the induced voltage is a voltage sufficient to induce hot carrier injection from the channel region to the floating gate; and biasing a body of the flash memory cell relative to a source of the flash memory cell with a relative bias which reduces band-to-band tunneling.

9. The method of claim 8, further comprising a step of biasing a drain at a voltage lower than a bias on the source, prior to the step of changing, thereby creating channel current from the source to the drain from which carriers are injected to the floating gate.

10. The method of claim 8, further comprising a step of biasing the source at a voltage lower than a bias on a drain, prior to the step of changing, thereby creating channel current from the drain to the source from which carriers are injected to the floating gate.

11. The method of claim 8, wherein the step of changing is a step of dropping the control gate bias from a high negative voltage relative to a cell body to a zero voltage relative to the cell body.

12. The method of claim 8, wherein the step of erasing and the step of changing are done with each semiconductor junction of the flash memory cell being unbiased or reverse biased.

13. The method of claim 8, wherein the flash memory cell is an isolated P-well flash memory cell.

14. The method of claim 8, wherein the flash memory cell is a substrate cell.

* * * * *